(12) United States Patent
Popescu

(10) Patent No.: US 8,988,145 B2
(45) Date of Patent: Mar. 24, 2015

(54) HIGH FIDELITY CURRENT DUMPING AUDIO AMPLIFIER WITH COMBINED FEEDBACK-CLEAN FEEDBACK

(71) Applicant: Barbu Popescu, Craiova (RO)

(72) Inventor: Barbu Popescu, Craiova (RO)

( * ) Notice: Subject to any disclaimer, the term of this patent is extended or adjusted under 35 U.S.C. 154(b) by 0 days.

(21) Appl. No.: 13/684,531

(22) Filed: Nov. 24, 2012

(65) Prior Publication Data

US 2013/0181778 A1    Jul. 18, 2013

(51) Int. Cl.

| | |
|---|---|
| *H03F 3/45* | (2006.01) |
| *H03F 1/32* | (2006.01) |
| *H03F 1/34* | (2006.01) |
| *H03F 3/187* | (2006.01) |
| *H03F 3/30* | (2006.01) |

(52) U.S. Cl.
CPC .......... *H03F 3/45076* (2013.01); *H03F 1/3223* (2013.01); *H03F 1/34* (2013.01); *H03F 3/187* (2013.01); *H03F 3/3076* (2013.01); *H03F 3/45475* (2013.01); *H03F 2203/30078* (2013.01); *H03F 2203/30111* (2013.01); *H03F 2203/45138* (2013.01)
USPC .......................................................... 330/69

(58) Field of Classification Search
CPC ............................... H03F 3/45; H03F 3/45609
USPC ..................... 330/69, 255, 260; 381/120, 121
See application file for complete search history.

(56) References Cited

U.S. PATENT DOCUMENTS

| | | | | |
|---|---|---|---|---|
| 1,686,792 A | * | 10/1928 | Black | 330/149 |
| 2,102,671 A | * | 12/1937 | Black | 330/57 |
| 8,004,355 B2 | * | 8/2011 | Jones et al. | 330/98 |

OTHER PUBLICATIONS

Walker, P. J., "Current Dumping Audio Amplifier", Wireless World, Dec. 1975, pp. 560-562.*

* cited by examiner

*Primary Examiner* — Steven J Mottola

(57) ABSTRACT

A high fidelity current dumping audio amplifier in which for achieving the best performance are combined the feedforward error correction and the negative feedback. The principle of feedforward error correction in a balanced bridge in A.C. is used, including the whole audio frequency amplifier, combined with a classical negative feedback that includes the items of the amplification chain likely to introduce distortions. The amplifier can be built in a current amplifier structure or in a voltage amplifier structure. The current amplifier structure contains an operational amplifier used as a voltage-current converter and signal de-phasing, two low power symmetrical current amplifiers operating in "A" class with a current mirror structure and a power stage in "B" class, with no quiescent current. The voltage structure of the amplifier contains an operational voltage amplifier, a low power amplifier operating in "A" class, and a power stage operating in "B" class.

8 Claims, 3 Drawing Sheets

HIGH FIDELITY CURRENT DUMPING AUDIO AMPLIFIER WITH COMBINED FEEDBACK-CLEAN FEEDBACK

BACKGROUND OF THE INVENTION

1. Field of the Invention

The invention relates to a high fidelity audio amplifier which uses a new structure of combinated feedback composed by feedforward error correction and a negative feedback loop.

The invention develops a new structure of the feedback loops that can be used in an audio amplifier in order to improve performances using the advantages offered by feedforward error correction and negative feedback, both patented by H. S. Black, U.S. Pat. No. 2,102,671 and U.S. Pat. No. 1,686,792.

2. Description of the Prior Art

There have been made advances in the past years in the design of high fidelity audio frequency amplifiers but with new improvements new flaws are discovered.

The negative feedback largely used in audio frequency amplifiers, next to the indisputable advantages it offers (reduces distortions, increases the bandwidth, controls the amplifier response, etc.) has some disadvantages too (cannot minimize the distortions, can generate instability, decreases the overall gain, etc.

The feedforward error correction mainly allows cancelation of errors, i.e. distortion introduced by the amplifier in terms of stability and doesn't present a feedback loop that might leads to instability.

The invention try to solve another problems of a conventional amplifier i.e. poor linearity of the output power stage characteristics, poor thermal stability of the conventional output class AB stages, by using a class B output stage, without quiescent current, controlled by the combined feedback, the clean feedback.

Using combined feedback, the voltage distortion of the amplifier can be effectively improved by the negative feedback loop in the high frequency regions.

The object of this invention is to provide a new structure of the feedback loops which allow to obtain a simple, but high performance audio amplifier in terms of stability, low harmonic and intermodulation distortion, excellent dynamic performance and above all outstanding sonic performance.

BRIEF SUMMARY OF THE INVENTION

The present invention has been developed with a view to solve the disadvantages of the conventional amplifiers and to provide an improved amplifier circuit in which the problems caused by nonlinearity of the output power stages are solved, the voltage distortion rate in the high frequency regions of the audio spectrum is improved, which reduces the group delay in time domain, and the thermal stability of the output stage is improved using a class B stage.

The presented invention relates to an audio amplifier that uses a feedforward error correction based on the principle of the balanced bridge in order to minimize distortion of the output stage, followed by application of classical negative feedback loop in order to obtain a very low level of harmonic and intermodulation distortion.

In conventional audio amplifiers the output signal taken from the output in the negative feedback loop is distorted; in the amplifier circuit of the present invention the output feedback signal in the negative feedback loop have a very low level of distortion because it was previously cleaned up by the feedforward error correction loop, and the feedback is a clean feedback.

The effect of combined feedback increases at high frequencies and permit to reduce the level of high order harmonics and intermodulation products generated by the output stage.

In order to improve performances both loops, feedforward error correction and negative feedback are current feedback loops.

DETAILED DESCRIPTION OF THE INVENTION

The presented invention "HIGH FIDELITY CURRENT DUMPING AUDIO AMPLIFIER WITH COMBINED FEEDBACK-CLEAN FEEDBACK" relates to a high-fidelity audio frequency amplifier that uses the feedforward error correction and the negative feedback in order to improve performance. The negative feedback largely used in audio frequency amplifiers next to the indisputable advantages it offers, (reduces distortions, increases the bandwidth, controls the amplifier's response, etc.) has some disadvantages too (can not minimize the distortions, can generate instability, decreases the overall gain, etc.).

The feedforward error correction mainly allows cancelation of errors, i.e. distortion introduced by the amplifier in terms of stability and doesn't present a feedback loop that might lead to instability.

The feedforward error correction was used in the Quad 405-909 audio amplifiers, using the principle of balanced bridge in A.C.

The presented invention relates to an audio frequency amplifier that uses a feedforward error correction based on the principle of balanced bridge in A.C. in order to minimize distortions, followed by application of classical negative feedback loop, in this case the output feedback signal is "clean", obtaining a very low level of harmonic and intermodulation distortion.

Figure 1:
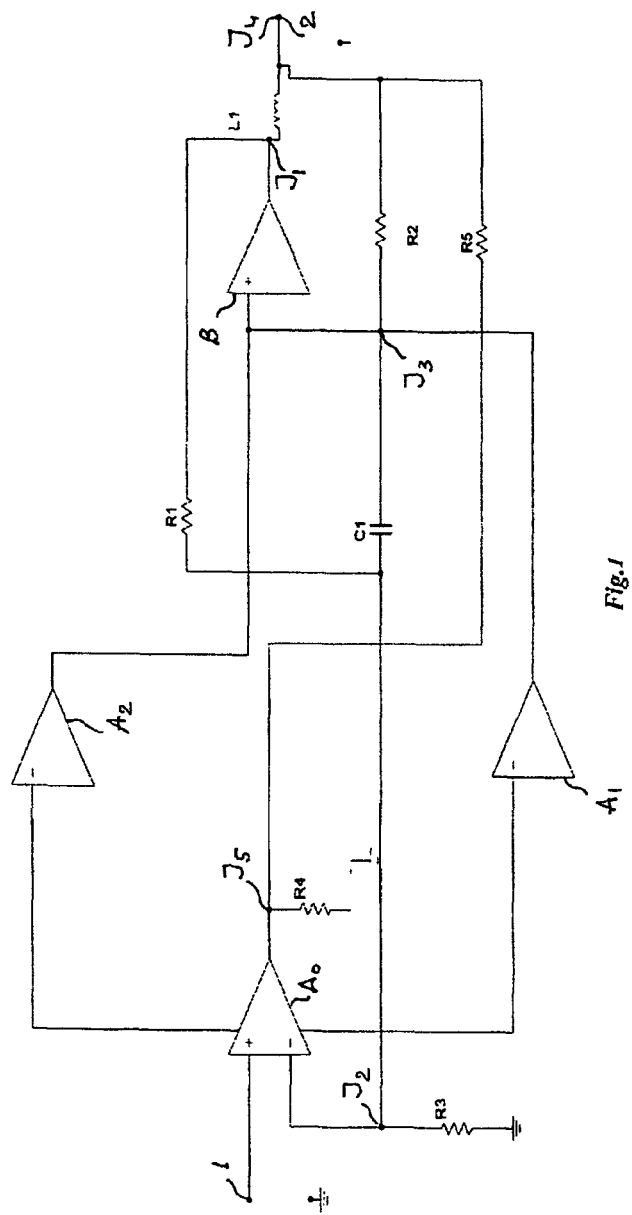
FIG. 1 is a circuit block diagram of a symmetrical current dumping audio (current) amplifier using combined feedback.

The block diagram of a symmetrical current dumping audio frequency current amplifier using combined feedback, clean feedback, is presented in FIG. 1 where:

A0=low level operational amplifier connected as voltage to current converter

A1, A2=inverting low power current amplifiers operating in "A" class.

B=current amplifier, with unity voltage gain, without quiescent current, in "B" class.

The audio frequency signal applied to A0 at the input terminal 1 is amplified by this; due to the R4 low value load resistance, in the power supply circuit of A0 will appear variations of the supply current used to control amplifiers A1 and A2, appropriate to the two half signal alternation.

At low level, the output signal is ensured by the low power amplifiers in "A" class, A1 and A2; when the level increases, the voltage drop across the R2 resistor increases, the current amplifier B begins to dump current to the output load terminal 2 thru the L1 coil.

Reducing crossover distortions that occur when passing from "A" class to "B" class is ensured by including the amplifier in a balanced bridge in A.C., with the equilibrium condition: L1=R1C1R2, connected at the junction points J1,J2,J3, J4.

Part of the audio signal taken after the L1 coil at junction point J4, "cleaned" by distortions, is applied through the divisor made out of R4 and R5 resistors to the amplifier A0, at the junction point J5; negative feedback loop includes the output stage of the A0 amplifier, the A1,A2, amplifiers and the current amplifier B.

Due to the fact that the audio signal applied in the negative feedback loop is previously "cleaned" of distortions by the feedforward error correction, a low level of harmonic and intermodulation distortion is obtained.

Figure 2:
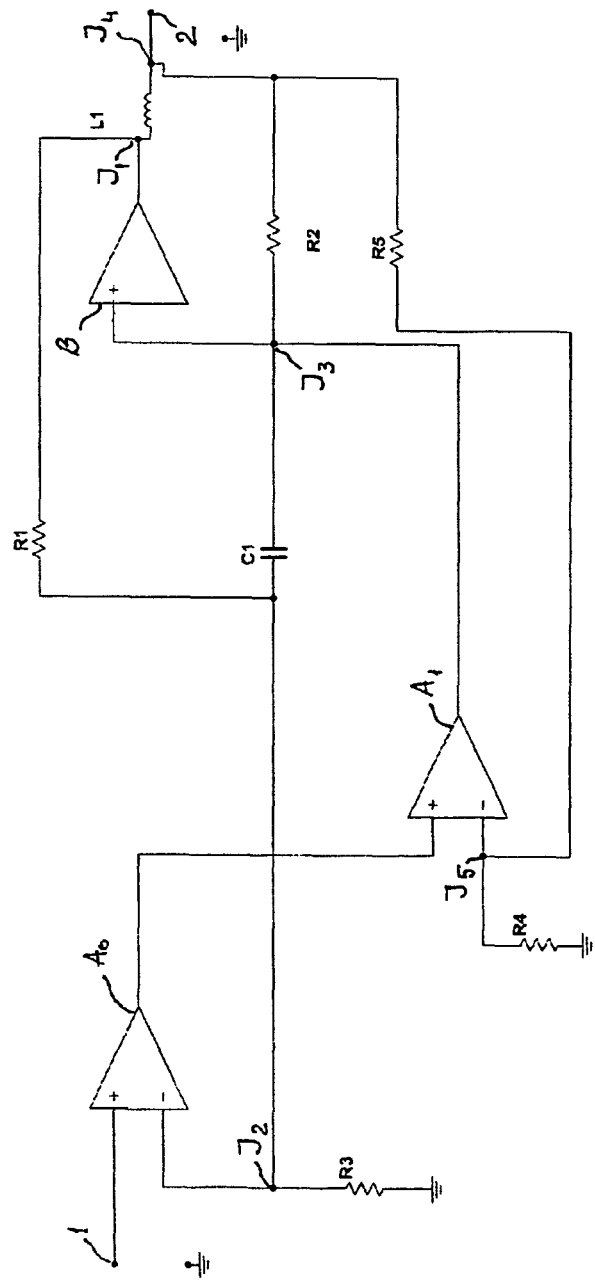
FIG. 2 is a circuit block diagram of a current dumping audio (voltage) amplifier using combined feedback.

In FIG. 2 is presented the block diagram of a current dumping audio frequency voltage amplifier with combined feedback, clean feedback.

In the block diagram in FIG. 2:
A0=low level operational voltage amplifier.
A1=low power amplifier operating in "A" class.
B=current amplifier, with unity voltage gain, without quiescent current, operating in "B" class.

Low level amplifier A0 amplifies the audio frequency signal applied to the input terminal 1, which is then amplified by the low power amplifier in "A" class, A1.

At low level, the output current is supplied by the low-power amplifier operating in "A" class, A1.

When the level increases, the voltage drop across the R2 resistance increases, the output current amplifier B begins to dump current to the output terminal 2 thru the L1 coil.

Reducing crossover distortions from "A" class to "B" class is ensured by including the current amplifier B in a balanced bridge in A.C., L1,C1,R1,R2, with equilibrium condition: L1=R1R2C1, connected at the junction points J1,J2,J3,J4.

Part of the output audio signal, taken at the junction point J4, "cleaned" by distortions, is applied with the resistive divisor R5/R4 to the inverting port of the A1 amplifier, at the junction point J5, further reducing distortions, using a negative feedback loop.

Figure 3:
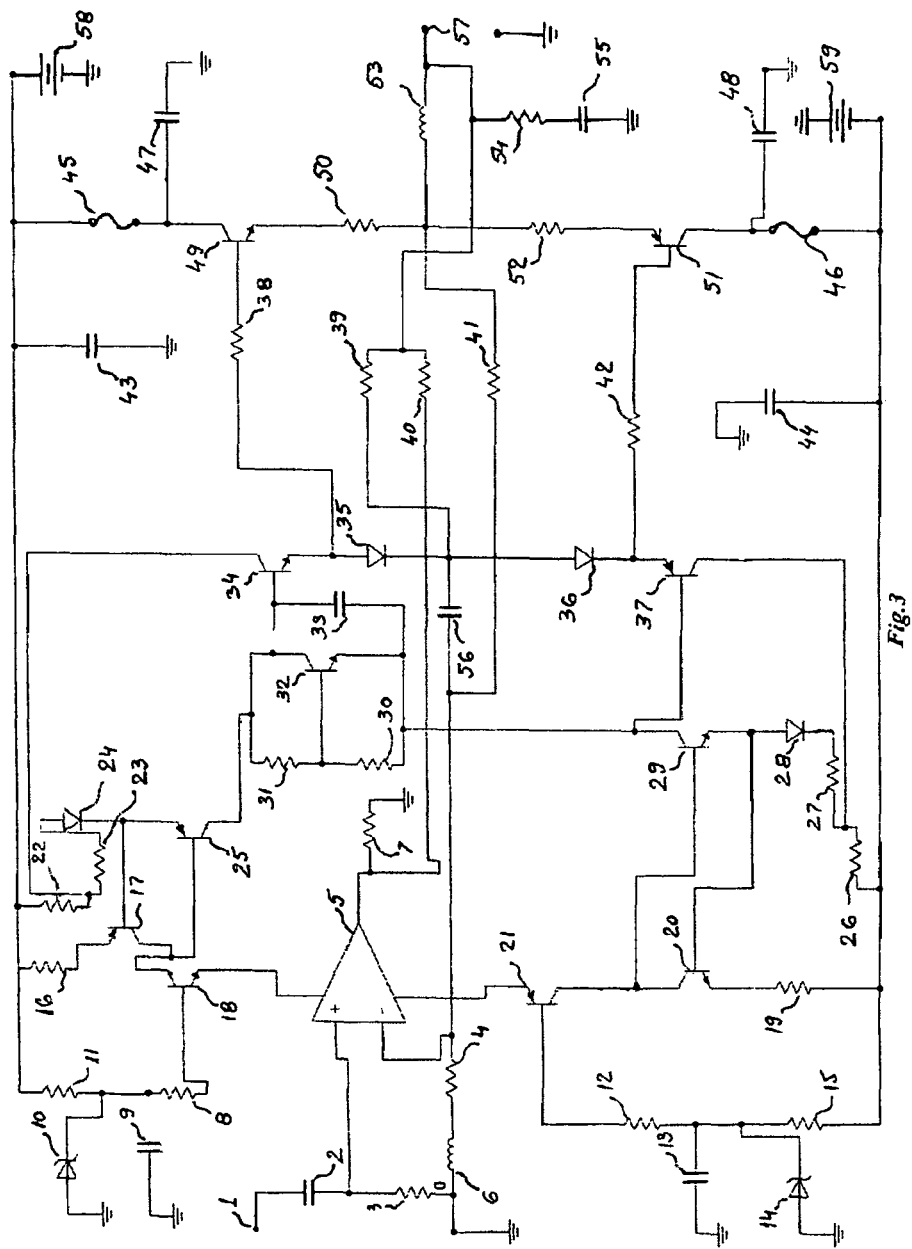
FIG. 3 is an electrical schematic diagram of a symmetrical current dumping audio amplifier using combined feedback.

In FIG. 3 is an electrical schematic diagram of a symmetrical current dumping audio frequency amplifier with combined feedback, using the circuit block diagram from FIG. 1.

The audio signal taken from the input terminal 1 is applied by capacitor 2 on the input of the operational amplifier 5 and it is amplified by it. Due to the low value of the load resistance 7, in the supply circuit of the operational amplifier 5, achieved with diode 10, capacitor 9, resistor 11, resistor 8, transistor 18 for the positive supply port and diode 14, capacitor 13, resistor 15, resistor 12, transistor 21 for the negative supply port there will appear current variations, with opposite phase, appropriate for the two half alternating of the audio signal, operational amplifier 5 acting as a voltage-current converter.

The load for the level shifter stages achieved with transistors 8 and 21 are Wilson current mirrors achieved with transistor 17, resistors 16, 22 and 23, diode 24, transistor 25 and transistor 20, resistors 19, 26 and 27, diode 28, transistor 29. The audio frequency signal is current amplified in "A" class stage, achieved with transistor 34 for a half alternation and with transistor 37 for the other half alternation of the signal.

In order to improve performance, the current mirrors are provided with a local feedback loop, achieved by connecting the transistor 34 collector, respectively 37 in the emitter circuit of transistors 25 and 29, through resistive divisor formed of resistors 22, 23, and 26, 27.

These values are chosen so that in idle the operating conditions of the current mirror do not change.

Transistor 32, resistor 31, resistor 30, capacitor 33 form on one hand a super diode circuit, with important role in establishing a correct mode of operation for the current mirrors and for amplifier thermal stability, and on the other hand acts as a current-voltage converter.

The audio signal in the emitter of transistor 34 is applied by the diode 35 and resistor 39 to the load terminal 57 for positive half alternation, respectively in the emitter of transistor 37 by diode 36 and resistor 39 for the negative half alternation.

In the absence or low signal, final power transistors 49 and 51 do not conduct, the signal is taken from the emitter circuit of transistors 34 and 37 with resistor 39 and applied to load at the output terminal 57.

When the signal level increases, the voltage drop on resistor 39 increases and summed with the one on diodes 35 and 36 determine the opening of power transistors 49 and 51 which at low level do not conduct.

Reducing crossover distortions which appear when passing from "A" class of signal operation at low level to "B" class at high level of signal is made using the principle of balanced bridge in A.C. formed by coil 53, resistor 41, resistor 39 and capacitor 56.

The balanced bridge acts effectively on the entire amplifier, significantly reducing distortions.

If it weren't for the additional negative feedback loop made of resistors 40 and 7, this could be the structure of an audio frequency amplifier with good performances.

By introducing this additional negative feedback loop, a fraction of the output signal, a signal "cleaned" by distortions through the balanced bridge in A.C., is applied by the divisor formed from resistance 40 and 7 to the output of the operational amplifier 5.

In the negative feedback loop are included output transistors of the operational amplifier, the level shifter stage made with transistor 18, the Wilson current mirrors made with transistors 17, 25, 34 and the output stage made with power transistor 49 for a half alternation, as well as the level shifter stage made with transistor 21, the Wilson current mirror made with transistors 20, 29, 37, the output stage made with the power transistor 51 for the other half alternation of the audio signal, further reducing distortions.

The series circuit made of resistor 55 and capacitor 54 has the role to prevent high frequency oscillations.

Coil 6 has the role to provide roll off of response at high frequency.

Resistors 50 and 52 produce a slight local negative feedback and improve the thermal stability of the power transistors at high level.

Fuses 45 and 46 have the role to protect the power transistors.

Capacitors 43, 47 and 44, 48 have the role to cut the supply route and to prevent oscillations which can appear because of the supply circuit.

Power supply is made from two voltage sources, 58 and 59, symmetrical, unregulated, properly sized.

Using the combined feedback, a symmetrical structure with the current mirrors with local feedback, allows obtaining high performances under a scheme with a relatively simple structure.

What is claimed is:
1. A symmetric current dumping audio amplifier as in FIG. 1/3 comprising:
an operational amplifier (A0) connected as voltage to current converter having a non-inverting input, an inverting input, a positive bias port, a negative bias port and an output connected to a ground thru a resistor;

a first low power current amplifier (A1), operating in class "A" having an inverting input connected to the negative bias port of the said operational amplifier (A0);

a second low power current amplifier (A2) operating in class "A" having an inverting input connected to the positive bias port of the said operational amplifier (A0);

a power stage operating in "B" class having a non-inverting input connected to the output of the said first low power current amplifier operating in class "A" and to the output of the said second low power amplifier operating in class "A" and an output connected to a load thru an inductor;

the load connected between the said inductor and the ground;

a feedforward error correction bridge comprising of resistors (R1), (R2), inductor (L1), capacitor (C1) connected to the inverting input of the said operational amplifier (A0) at junction point (J2), to the non-inverting input of the said power stage operating in "B" class at the junction point (J3) at the output of the said power stage operating in "B" class at junction point (J1) and to the said load in junction point (J4);

a negative feedback loop comprising of resistors (R5), (R4) between the said load at the junction point (J4) and to the output of the said operational amplifier (A0) at junction point (J5).

2. A symmetric amplifier as claimed in claim 1 comprising of a feedforward error correction bridge connected between the non inverting input of the said operational amplifier (A0), the input and the output of the said power stage operating in "B" class, to the said load followed by an additional negative feedback loop connected between the said load and the output of the said operational amplifier (A0) to create a clean feedback loop for achieving the best performance.

3. A symmetric amplifier as claimed in claim 1 which uses current amplification and current feedback loops comprising feedforward error correction bridge and negative feedback loop for achieving the best performance.

4. A symmetric amplifier as claimed in claim 1 where the balance of the feedforward error correction bridge is obtained in a specific frequency region.

5. A current dumping audio amplifier as in FIG. 2/3 comprising:
a voltage amplifier (A0) having a non-inverting input, an inverting input and an output;
a low power audio amplifier (A1) operating in class "A" having a non inverting input connected to the output of the said voltage amplifier (A0), an inverting input and an output terminal;
a power output stage operating in class "B" having a non-inverting input connected to the output of the said low power audio amplifier (A1) operating in class "A" and an output connected to a load thru an inductor;
the load connected between the said inductor and to a ground;
a feedforward error correction bridge comprising resistors (R1), (R2), inductor (L1) and capacitor (C1) connected at the inverting input of the said operational amplifier (A0) at the junction point (J2) to the non inverting input of the said power stage operating in "B" class at the junction point (J3) at the output of the said power stage operating in "B" class at the junction point (J1) and to the said output terminal at the junction point (J4);
a negative feedback loop comprising resistors (R4), (R5), connected between the said load at the junction point (J4) and the inverting input terminal of the said low power amplifier (A1) operating in class "A", at the junction point (J5).

6. An amplifier as claimed in claim 5 which uses feedforward error correction bridge and a negative feedback loop for achieving the best performance.

7. An amplifier as in claim 5 where the balance of the feedforward error correction bridge is obtained in a specific frequency region.

8. A symmetrical current dumping audio amplifier as in FIG. 3/3 comprising of:
an operational amplifier (A0) having a non-inverting input as a signal input, an inverting input, a negative bias port, a positive bias port and an output connected to a ground thru a resistor, used as a tension-current converter;
a first low power current amplifier operating in class "A" having an input connected to the negative bias port of the said operational amplifier comprising of a level shifter loaded on a Wilson current mirror circuit with local feedback, and a low impedance output terminal using an emitter follower;
a second low power current amplifier operating in class "A" having an input connected to the positive bias port of the said operational amplifier comprising of a level shifter loaded on a Wilson current mirror circuit with local feedback, and a low impedance output terminal using an emitter follower;
a temperature compensating current control and a current to voltage converter comprising of a transistor connected in a Vbe multiplier structure;
a power stage having an input connected between the low impedance output of the said first low power current amplifier operating in class "A" and the second said low power current amplifier operating in class "A", and the output connected to a load thru an inductor, comprising of a pair of transistors of opposite polarity;
a feedforward error correction bridge circuit comprising of resistors (39),(41), inductor (53) and capacitor (56) connected at the output terminal of the said power stage at the junction point (J1), at the inverting input of the said operational amplifier (5) at the junction point (J2), at the output of the said first and second low power amplifiers operating in class "A" at the junction point (J3) and at the load at the junction point (J4);
a negative feedback loop comprising of resistors (40), (7) connected between the said load terminal of the amplifier at the junction point (J4) and at the output terminal of the said operational amplifier at the junction point (J5), used as an input terminal for the negative feedback loop circuit.

* * * * *